(12) United States Patent
Law et al.

(10) Patent No.: US 6,444,277 B1
(45) Date of Patent: Sep. 3, 2002

(54) METHOD FOR DEPOSITING AMORPHOUS SILICON THIN FILMS ONTO LARGE AREA GLASS SUBSTRATES BY CHEMICAL VAPOR DEPOSITION AT HIGH DEPOSITION RATES

(75) Inventors: Kam S. Law, Union City; Robert Robertson, Palo Alto; Pamela Lou, San Francisco; Marc Michael Kollrack, Alameda; Angela Lee, Sunnyvale; Dan Maydan, Los Altos Hills, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/303,566

(22) Filed: Sep. 9, 1994

Related U.S. Application Data

(63) Continuation of application No. 08/218,857, filed on Mar. 28, 1994, now abandoned, which is a continuation of application No. 08/010,118, filed on Jan. 28, 1993, now abandoned.

(51) Int. Cl.[7] .............................. B05D 3/06; C23C 16/24
(52) U.S. Cl. ................. 427/574; 427/535; 427/255.18; 427/255.28; 427/255.7; 427/573
(58) Field of Search ................................ 427/574, 573, 427/570, 578, 535, 166, 309, 255.7, 248.1; 148/DIG. 1; 437/101, 937

(56) References Cited

U.S. PATENT DOCUMENTS

| 4,436,761 A | * | 3/1984 | Hayashi et al. | 427/578 |
|---|---|---|---|---|
| 4,854,263 A | * | 8/1989 | Chang et al. | 118/715 |
| 4,892,753 A | | 1/1990 | Wang et al. | 427/38 |
| 4,905,066 A | * | 2/1990 | Dohjo et al. | 357/23.15 |
| 4,951,601 A | | 8/1990 | Maydan et al. | 117/719 |
| 4,987,856 A | * | 1/1991 | Hey et al. | 118/723 |
| 5,151,255 A | * | 9/1992 | Fukuda et al. | 422/186.05 |
| 5,214,002 A | * | 5/1993 | Hayashi et al. | 437/234 |
| 5,246,744 A | * | 9/1993 | Matsuda et al. | 427/578 |
| 5,258,207 A | * | 11/1993 | Iwamoto et al. | 427/578 |
| 5,264,710 A | * | 11/1993 | Yamagishi et al. | 427/578 |

FOREIGN PATENT DOCUMENTS

| JP | 62-136870 | * | 6/1987 | |
|---|---|---|---|---|
| JP | 63--197.329 | | 8/1988 | H01L/21/205 |
| JP | 63-215037 | | 9/1988 | H01L/21/205 |
| JP | 63-223178 | | 9/1988 | C23C/16/24 |
| JP | 2-494470 | | 2/1990 | H01L/29/784 |
| JP | 3-149525 | | 6/1991 | H01L/29/784 |
| JP | 4-342120 | | 11/1992 | H01L/21/205 |
| JP | 4-346419 | | 12/1992 | H01L/21/205 |

* cited by examiner

Primary Examiner—Roy King
(74) Attorney, Agent, or Firm—Birgit E. Morris

(57) ABSTRACT

Amorphous silicon thin films can be deposited onto large area glass substrates at high deposition rates by chemical vapor deposition using pressure of at least 0.8 Torr and temperatures of about 270–350° C. and fairly high gas flow rates of silane in a hydrogen carrier gas. The spacing between the inlet gas manifold and the substrate in the CVD chamber is maintained so as to maximize the deposition rate. Improved transistor characteristics are observed when the substrate is either exposed to a hydrogen plasma for a few seconds prior to high rate deposition of the amorphous silicon, or when a first layer of amorphous silicon is deposited using a slow deposition rate process prior to deposition of the high deposition rate amorphous silicon.

11 Claims, 1 Drawing Sheet

METHOD FOR DEPOSITING AMORPHOUS SILICON THIN FILMS ONTO LARGE AREA GLASS SUBSTRATES BY CHEMICAL VAPOR DEPOSITION AT HIGH DEPOSITION RATES

This is a continuation of U.S. application Ser. No. 08/218,857 filed Mar. 28, 1994, which is a continuation of U.S. application Ser. No. 08/010,118 filed Jan. 28, 1993, both now abandoned.

This invention relates to the deposition of amorphous silicon thin films onto large area glass substrates. More particularly, this invention relates to the deposition of active amorphous silicon thin films by chemical vapor deposition.

BACKGROUND OF THE INVENTION

In the manufacture of liquid crystal cells, two glass plates are joined together with a layer of a liquid crystal material sandwiched between them. The glass substrates have conductive films thereon (at least one must be transparent, such as an ITO film) that can be connected to a source of power to change the orientation of the liquid crystal material. Various areas of the liquid crystal cell can be accessed by proper patterning of the conductive films. More recently, thin film transistors have been used to separately address areas of the liquid crystal cell at fast rates. Such liquid crystal cells are useful for active matrix displays such as TV and computer monitors.

As the requirements for resolution of liquid crystal monitors have increased, it has become desirable to separately address a plurality of areas of the liquid crystal cell, called pixels. Since about one million pixels are present in modern displays, at least the same number of transistors must be formed on the glass plates so that each pixel can be separately addressed.

Different types of thin film transistors are in current use, but most require deposition of a gate dielectric layer over a patterned gate metal with an amorphous silicon layer thereover. Metal contacts are deposited over the amorphous silicon film, which can have a thin layer of dopes silicon thereover to improve contact between the amorphous silicon and the overlying aluminum contacts.

It is known how to deposit amorphous silicon layers by glow discharge or a plasma type process. However, the rate of deposition of the films is quite low, e.g., about 100–300 angstroms per minute. Since films up to about 5000 angstroms in thickness are required for the manufacture of thin film transistors, comparatively lengthy deposition times are required, which increases the cost of making these films. It would be desirable to improve the deposition rate of CVD films to reduce costs.

Because of the large size and weight of glass substrates, which are for example about 350×450×1.1 mm in size, generally large reaction chambers are required for deposition of thin films thereon, and large and often slow transfer equipment is needed to transfer the substrates from one reaction chamber to another for sequential deposition of these thin films.

However, recently a vacuum system has been made of multiple chambers that can bring a plurality of substrates to vacuum, heat them batch wise to CVD temperatures, transfer them singly to specially designed CVD chambers that can deposit thin films of, inter alia, amorphous silicon, and transfer them back to a cooling chamber, all without leaving a vacuum environment. However, in order to maximize the efficiency of such a system, the idle time of the glass substrates within the system should be at a minimum.

Thus it would be highly desirable to improve the rate of deposition of amorphous silicon thin films to reduce the time needed to deposit films up to about 5000 angstroms in thickness.

SUMMARY OF THE INVENTION

We have found a method of depositing amorphous silicon thin films at a rate generally an order of magnitude higher than prior art processes. When this process is used in a vacuum system as described above, the time required for deposition of the thin films is greatly reduced, thereby improving the efficiency of the overall processing of large area glass substrates to form transistors thereon.

The improved deposition rate is achieved by optimizing processing parameters including gas flow rates, pressure, RF power, substrate temperature and the spacing between the gas manifold and the substrate.

Transistor characteristics of the high deposition rate amorphous silicon layer are improved by modifying the interface of the substrate layer, either by exposing the surface to a hydrogen plasma for a short period of time prior to depositing the high rate amorphous silicon of the invention, or by depositing a first layer of amorphous silicon using a slow deposition rate process prior to deposition of amorphous silicon in accordance with the high rate deposition process of the invention.

DETAILED DESCRIPTION OF THE INVENTION

We have found that we can deposit amorphous silicon films over large area glass substrates having preformed gate metal areas and a gate dielectric layer deposited thereon by CVD processing at an improved deposition rate. The improved deposition rates are achieved with a high flow of silane and by optimizing the processing parameters including the pressure, RF power, gas flow, electrode spacing and substrate temperature.

In order to improve the transistor characteristics of devices made with these films, two means of affecting the interface between the amorphous silicon and the substrate have been developed; a dual layer amorphous silicon deposition, and hydrogen plasma stabilization prior to the amorphous silicon deposition. In the dual layer implementation, a thin layer of a low deposition rate (1000 angstroms/min or less) amorphous silicon of approximately 1000 angstroms in thickness or less is deposited prior to the high deposition rate amorphous silicon film of the invention. In the hydrogen plasma stabilization implementation, a hydrogen plasma is run for a short period of time, e.g., approximately 10 seconds, immediately before the deposition of high deposition rate amorphous silicon of the invention is carried out.

U.S. Pat. No. 4,892,753 to Wang et al, incorporated herein by reference, describes a plasma enhanced CVD reactor having features suitable for carrying out the present CVD processes. Although the reactor of this reference is described in terms of processing semiconductor wafers, suitable adjustments of size will accommodate the present large area glass substrates.

The reactor will be further described with reference to FIG. 1.

Figure 1:
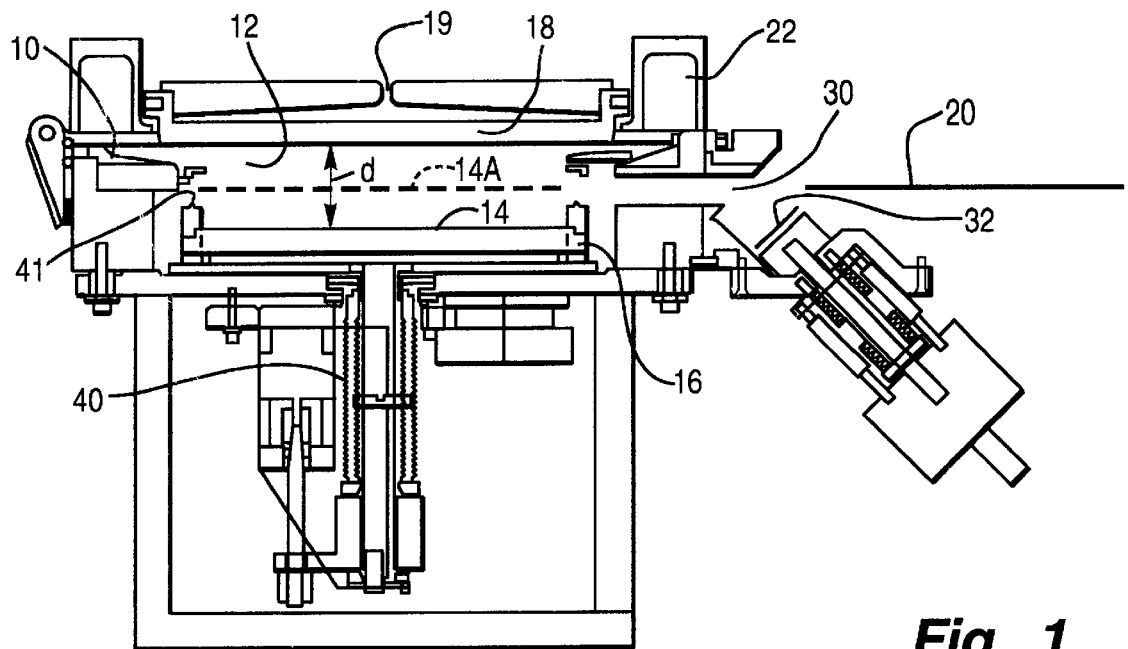
FIG. 1 is a cross sectional view of a CVD reactor useful for deposition of amorphous silicon thin films onto large area glass substrates.

FIG. 1 is a cross sectional view of a vacuum chamber 10, typically made of aluminum, that has a reaction region 12. A substrate 14 is supported on a suitable support or susceptor 16 that can be heated, as by a resistive heater embedded in the susceptor. Above the substrate 14 is a gas manifold plate 18 which supplies the precursor reaction gases, carrier gases and purge gases from a gas inlet 19 to the reaction region 12. The spacing -d- between the substrate 14 and the gas manifold 18 is adjustable by an elevator assembly 40. The ability to adjust the spacing enables the process to be optimized over a wide range of conditions while maintaining the required film uniformity over the area of the glass substrate. The spacing -d- between the substrate 14 and the gas manifold plate 18 is typically about one inch.

The elevator assembly 40 has a dual function. When a substrate 14 is transferred into the chamber 10 by means of a substrate support arm 20 operated by a robot in an adjacent chamber (not shown) the position of the substrate 14 in the chamber initially is shown by the dotted line 14A. At that time the lift pins 41 are raised to support the substrate. The elevator assembly 40 then raises the susceptor 16 and the substrate 14 to the processing position. A closable opening 30 is opened to allow entry and exit of the substrate 14 by the robot support arm 20. During processing, the closable opening 30 is closed by means of a piston driven slit valve 32.

The gas manifold plate 18 is a plate having a plurality of openings therethrough uniformly distributed over the plate 18. A typical manifold plate 18 useful herein has about 10,000 openings in the plate which is about the same size as the substrate 14.

The gas manifold plate 18 is part of a gas distribution system that flows the process gases uniformly across the substrate 14 and radially outwardly to the edges of the substrate and beyond, where they are removed by evacuation port 22. A shield or shadowframe 24 prevents deposition onto the edges of the substrate 14.

The temperature of the gas manifold 18 is regulated so as to minimize deposition of the solid products of the reaction onto the gas manifold 18.

An RF power supply and matching network (not shown) create and sustain a plasma of the process gases from the precursor gases in the reaction region 12. Preferably high frequency RF power of 13.56 MHz is employed, but this is not critical and lower frequencies can be used. Further, the gas manifold plate 18 is RF driven, while the susceptor or substrate support 16 is grounded. The walls of the chamber can be protected with ceramic. This design allows a high degree of plasma confinement between the gas manifold 18 and the support 16, thereby increasing the concentration of reactive species and the deposition rate of the subject thin films.

By maintaining the spacing -d- between the gas manifold plate 18 and the substrate 14 relatively small, the chamber 10 itself can be made smaller and the deposition process is more controllable; further, the small volume of the reaction region 12 allows rapid changes in the gas components fed to the reaction region 12, and reactant gases and purge gases can be rapidly removed between sequential depositions.

Amorphous silicon thin films are deposited in accordance with the invention using silane as the precursor gas (100 to 1500 sccm) in a hydrogen carrier gas (500 to 2000 sccm). Unexpectedly we have found that amorphous silicon thin films can be deposited at rapid rates under certain conditions to a thickness suitably from about 300–3000 angstroms.

The quality of the amorphous silicon films is measured by bonding of hydrogen in the film, as measured by IR absorption. An Si—H peak position at 2000 cm$^{-1}$ and full width at half max of less than 110 cm$^{-1}$ are indicators of a good quality amorphous silicon film. A high quality amorphous silicon films must also produce good transistor electrical characteristics, such as threshold voltage, electron mobility and leakage current in the off mode.

The temperature of the glass plates must be high enough for efficient deposition but must be maintained below about 450° C. when the large glass substrates may warp. In general a deposition temperature of from about 270–350° C. is maintained for amorphous silicon thin films.

The pressure of the present deposition process maintained at a somewhat higher level than prior art processes, which we believe contributes to the high deposition rates achieved herein. In general, the pressure in the reaction chamber should be maintained above about 0.5 Torr and is preferably maintained at about 0.8–1.5 Torr. In any event, thin films of amorphous silicon deposited at the above temperatures and pressures, and in the above-described variable spacing CVD reactor, results in deposition rates of about 500–3000 angstroms per minute, as contrasted to deposition rates of about 100–300 angstroms per minute for prior art processes and reactors, an order of magnitude improvement in deposition rate.

The present invention will be further illustrated in the following examples, but the invention is not to be limited to the details described therein.

EXAMPLE 1

Glass substrates 360×450×1.1 mm thick having a preselected pattern of gate metal pads deposited thereon in an array and having a layer of silicon oxide about 2500 angstroms thick and a layer of silicon nitride about 500 angstroms thick thereover was brought under vacuum and into the CVD chamber. The substrate was heated to 320° C. under flowing hydrogen and then an amorphous silicon thin film was deposited under the following conditions:

| | |
|---|---|
| SiH$_4$ | 275 sccm |
| H$_2$ | 1550 sccm |
| Power | 300 Watts |
| Pressure | 1.2 Torr |
| Spacing | 1000 mils |
| Chamber Temperature | 397° C. |
| Substrate Temperature | 320° C. |

The amorphous silicon deposition rate was 944 angstroms/min and the film was deposited to a thickness of 3000 angstroms. The stress in this film was measured to be −6.9×10$^9$ dynes/cm$^2$. The Si—H peak position was 2000 cm$^{-1}$ and the peak width was <120 cm$^{-1}$.

Completed transistors made with the above substrate were tested and found to have satisfactory device characteristics, including threshold voltage, mobility and leakage current in the off mode. The characteristics were comparable to those achieved when using prior art deposition equipment and processes.

EXAMPLE 2

Slow Deposition Rate Process

The procedure of Example 1 was followed except that two layers of amorphous silicon were deposited sequentially in the same chamber. The first layer was deposited to a thickness of 500 angstroms using the following conditions:

| | | |
|---|---|---|
| SiH$_4$ | 275 | sccm |
| H$_2$ | 1550 | sccm |
| Power | 300 | Watts |
| Pressure | 0.8 | Torr |
| Spacing | 1000 | mils |
| Susceptor Temperature | 397° | C. |
| Substrate Temperature | 310° | C. |

The deposition rate was 480 angstroms/min. The films deposited with this process were of good quality as measured by IR absorption.

Rapid Deposition Rate Process

A second layer was deposited over the above layer to a total thickness of 3000 angstroms using the following conditions:

| | | |
|---|---|---|
| SiH | 1320 | sccm |
| H$_2$ | 1550 | sccm |
| Power | 900 | Watts |
| Pressure | 0.8 | Torr |
| Spacing | 1000 | mils |
| Susceptor Temperature | 397° | C. |
| Substrate Temperature | 310° | C. |

The deposition rate of this process was 3100 angstroms/min. The films produced by this process were of good quality as measured by IR absorption.

Semiconductor devices made with this dual layer of amorphous silicon had electrical characteristics comparable to those of Example 1 and prior art deposition equipment and processes even though it was deposited at a much higher rate.

EXAMPLE 3

The procedure of Example 1 was followed except that a hydrogen plasma stabilization step was carried out prior to depositing 3000 angstroms of amorphous silicon using the rapid deposition rate process of Example 2. The hydrogen plasma stabilization was carried out for 10 seconds under the following conditions:

| | | |
|---|---|---|
| H$_2$ | 1550 | sccm |
| Power | 300 | Watts |
| Pressure | 0.8 | Torr |
| Spacing | 1000 | mils |
| Susceptor Temperature | 397° | C. |
| Substrate Temperature | 310° | C. |

The plasma remained on while the conditions were changed to those used for the deposition step, e.g., the silane gas flow was started and the power was increased to 900 Watts.

Devices produced using the hydrogen plasma stabilization and the rapid rate deposition of amorphous silicon had electrical characteristics comparable to those of Example 1 and devices produced in accordance with prior art deposition apparatus and methods.

Thus the deposition rate can be varied by varying the pressure, power and gas flow rates of the precursor gases. In general, higher silane:hydrogen ratios increases the deposition rate.

If desired, the amorphous silicon layer can be deposited over a silicon nitride layer deposited in accordance with the process described in copending application of Law et al, "Method for Depositing Thin Silicon Nitride Films" Ser. No. 08/010,109 filed Jan. 28, 1993, now abandoned.

Optionally, a thin n+ doped amorphous silicon layer can be deposited over the amorphous silicon layer deposited as described herein to reduce the resistance between the amorphous silicon and a subsequently deposited aluminum contact. This can be done following the procedure of Example 1 except adding 250 sccm of PH$_3$ as 0.5% by volume in a stream of hydrogen to the reactive gas mixture.

The above described CVD process can be utilized in systems known for multistep processing of semiconductor substrates, such as is disclosed by Maydan et al in U.S. Pat. No. 4,951,601 or in vacuum systems designed to deposit multiple layers onto large glass substrates for the manufacture of thin film transistors, as described in application of Norman Turner et al entitled "VACUUM PROCESSING APPARATUS HAVING IMPROVED THROUGHPUT", Ser. No. 08/010,684 filed Jan. 28. 1993, now abandoned and "METHOD OF HEATING AND COOLING LARGE AREA GLASS PLATES AND APPARATUS THEREFOR", Ser. No. 08/010,683 filed Jan. 28, 1993, now U.S. Pat. No. 5,607,009 and incorporated by reference herein. This vacuum system is described below with reference to FIG. 2.

Figure 2:
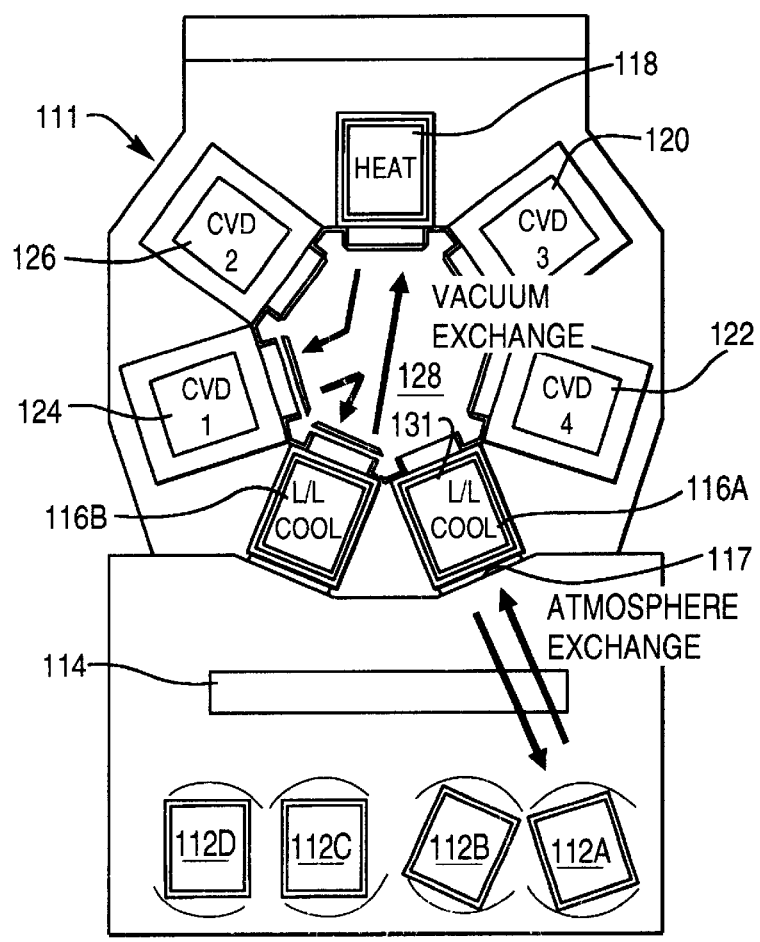
FIG. 2 is a plan view of a vacuum system for processing glass substrates including the CVD reactor of FIG. 1.

FIG. 2 is a plan view of a vacuum system for deposition of multiple films onto large glass substrates.

Referring now to FIG. 2, a deposition system 111 comprises a series of chambers for deposition of a plurality of thin films on large glass substrates. Cassettes 112A, 112B, 112C and 112D contain a plurality of shelves for the storage of large glass substrates thereon. A robot 114 is used to carry the glass substrates one at a time from the cassettes 112 into one of two combination cool and load lock chambers 116A and 116B through a closable opening 117 to atmosphere. The system 100 also includes a heating chamber 118 to bring the glass substrates up to CVD temperatures. A series of four CVD chambers 120, 122, 124 and 126, together with the two cooling/load lock chambers 116 and the heating chamber 118 define between them a vacuum transfer chamber 128. The cooling/load lock chambers 116A and 116B and the heating chamber 118 hold cassettes which are mounted on an elevator .assembly (not shown) that can be indexed vertically. These heating and cooling cassettes have thermally conductive shelves therein for supporting the glass substrates while they are being heated or cooled.

After the robot 114 transfers a glass substrate from a cassette 112 into a cassette of the cooling/load lock chamber cassette 116A, the elevator assembly raises (or lowers) the cassette by the height of one shelf, when another glass substrate is transferred to the cassette of the cooling chamber 116A by the robot 114. When all of the shelves in the cassette of the chamber 116A have been filled, the closable opening 117 is closed and the chamber 116A is evacuated. When the desired pressure is reached, a closable opening 131 adjacent the transfer chamber 128 is opened. A transfer robot (not shown) transfers all of the glass substrates from the cooling/load lock chamber 116A to a cassette in the heating chamber 118, where the glass substrates are heated to near deposition temperatures. The cassettes in the heating chamber 118 and the cooling chamber 116A are raised or lowered after each transfer to present a different shelf to the transfer robot in the transfer chamber 128.

When the glass substrates have reached deposition temperature, the transfer robot transfers the glass plate to one or more of the CVD chambers 120, 122, 124 or 126 sequentially, in a preselected order. For example, a film of silicon nitride may be deposited in the first CVD chamber 120, a film of amorphous silicon may be deposited in the second CVD chamber 122, a film of doped amorphous silicon may be deposited in the third CVD chamber 124 and so forth. When all of the preselected depositions have been made, the transfer robot transfers the processed glass substrates back to the cassette of the cool/load lock chamber 116A. The closable opening 131 is closed when all of the shelves in the cooling/load lock chamber 116A have been filled. Concurrently, the robot 114 is transferring another batch of glass substrates from a different cassette 112C to a cassette in the cooling/load lock chamber 116B and evacuating the chamber 116B when loading is complete.

When all of the processed glass substrates in the cooling/load lock chamber cassette 116A have been cooled to near room temperature, the chamber 116A is brought to ambient pressure, the closable opening 117 is opened and the robot 114 unloads the now processed glass substrates back to a cassette 112.

Thus the system 100 is built for continuous operation. The combination of batch heating and cooling of glass substrates, an operation that takes a relatively long period of time, e.g., several minutes, and single substrate CVD processing, which takes a comparatively short time, e.g., less than one minute, maximizes the throughput and efficiency of the system 100.

Although the invention has been described in accordance with certain embodiments and examples, the invention is not meant to be limited thereto. The CVD process herein can be carried out using other CVD chambers, adjusting the gas flow rates, pressure and temperature so as to obtain high quality films at practical deposition rates. The invention is meant to be limited only by the scope of the appended claims.

We claim:

1. A plasma chemical vapor deposition process comprising depositing an amorphous silicon layer from a precursor gas mixture of silane and hydrogen onto a glass substrate at a temperature in a range of about 270–350° C. and a pressure of at least about 0.8 torr in a vacuum chamber while maintaining a spacing between the gas inlet manifold and the substrate so that the silicon deposition rate is optimized.

2. A deposition process according to claim 1 wherein the pressure is maintained at about 0.8–1.5 Torr.

3. A deposition process according to claim 1 wherein a first layer of amorphous silicon is deposited onto the substrate with a low deposition rates of 1,000 angstroms/min or less to a thickness of up to about 1,000 angstroms.

4. A deposition process according to claim 1 wherein the substrate is exposed to a hydrogen plasma for about 10 seconds prior to depositing the amorphous silicon layer.

5. A deposition process according to claim 1 wherein a thin layer of n+ doped amorphous silicon is deposited over the amorphous silicon layer.

6. A deposition process according to claim 1 wherein said substrate is of glass having a patterned gate layer thereon.

7. A deposition process according to claim 6 wherein said substrate is of glass having a first patterned gate layer thereon and an overlying layer of a gate dielectric.

8. A deposition process according to claim 4 wherein said substrate is of glass having a patterned gate layer thereon.

9. A deposition process according to claim 4 wherein said substrate is of glass having a first patterned gate layer thereon and an overlying layer of a gate dielectric.

10. A deposition process according to claim 7 wherein said gate dielectric layer is silicon nitride.

11. A deposition process according to claim 9 wherein said gate dielectric layer is silicon nitride.

* * * * *